United States Patent
Park et al.

(10) Patent No.: US 11,069,846 B2
(45) Date of Patent: Jul. 20, 2021

(54) ULTRAVIOLET RAY EMITTING DEVICE HAVING MAXIMIZED ELECTRODE AREA FOR IMPROVED HEAT DISSIPATION

(71) Applicant: SEOUL VIOSYS CO., LTD., Ansan-si (KR)

(72) Inventors: Jun Yong Park, Ansan-si (KR); Jae Hyun Park, Ansan-si (KR); Yeo Jin Yoon, Ansan-si (KR); In Kyu Park, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 242 days.

(21) Appl. No.: 15/572,051

(22) PCT Filed: Apr. 25, 2016

(86) PCT No.: PCT/KR2016/004281
§ 371 (c)(1),
(2) Date: Nov. 6, 2017

(87) PCT Pub. No.: WO2016/178487
PCT Pub. Date: Nov. 10, 2016

(65) Prior Publication Data
US 2018/0145237 A1  May 24, 2018

(30) Foreign Application Priority Data
May 7, 2015 (KR) .................. 10-2015-0064060

(51) Int. Cl.
*H01L 33/64* (2010.01)
*H01L 25/075* (2006.01)
(Continued)

(52) U.S. Cl.
CPC ........ *H01L 33/647* (2013.01); *H01L 25/0753* (2013.01); *H01L 33/483* (2013.01);
(Continued)

(58) Field of Classification Search
CPC ..... H01L 33/647; H01L 33/641; H01L 33/62; H01L 33/483; H01L 25/0753
See application file for complete search history.

(56) References Cited

U.S. PATENT DOCUMENTS

2004/0149998 A1    8/2004  Henson et al.
2004/0218390 A1*  11/2004  Holman ................ G02B 5/045
                                                       362/245
(Continued)

FOREIGN PATENT DOCUMENTS

CN    202708713 U    1/2013
JP    2012-004595 A   1/2012
(Continued)

OTHER PUBLICATIONS

International Search Report in PCT/KR2016/004281, dated Aug. 2, 2016 (2 pages).

(Continued)

*Primary Examiner* — Matthew E. Gordon
(74) *Attorney, Agent, or Firm* — Perkins Coie LLP

(57) ABSTRACT

A light-emitting device is provided. The light-emitting device comprises: a first body unit including a base part and at least three conductive patterns positioned on the base part while including a plurality of element loading areas; and a plurality of light-emitting elements positioned on the plurality of element loading areas of the first body unit, wherein at least one conductive pattern among the conductive patterns is electrically connected to at least two light-emitting elements, the at least two light-emitting elements are connected to each other in series, at least two conductive patterns among the conductive patterns include pad electrode areas, an area of the plurality of conductive patterns is 80% or more of an upper surface area of the base part, and (Continued)

a separation distance among the plurality of conductive patterns is 200 μm to 2,400 μm.

20 Claims, 8 Drawing Sheets

(51) Int. Cl.
 H01L 33/48 (2010.01)
 H01L 33/62 (2010.01)
 H01L 33/60 (2010.01)
(52) U.S. Cl.
 CPC ............ H01L 33/62 (2013.01); H01L 33/641 (2013.01); H01L 33/486 (2013.01); H01L 33/60 (2013.01); H01L 2224/16225 (2013.01)

(56) References Cited

U.S. PATENT DOCUMENTS

| | | | | |
|---|---|---|---|---|
| 2009/0272971 | A1* | 11/2009 | Lee | H01L 27/153 257/43 |
| 2013/0001604 | A1* | 1/2013 | Shimonishi | H01L 25/0753 257/88 |
| 2013/0187190 | A1 | 7/2013 | Muramatsu et al. | |
| 2013/0270581 | A1* | 10/2013 | Lowes | H01L 33/48 257/88 |
| 2014/0104832 | A1* | 4/2014 | Duong | A01G 7/045 362/240 |
| 2015/0267906 | A1* | 9/2015 | Wilcox | F21V 23/003 362/311.02 |
| 2016/0233199 | A1* | 8/2016 | Cho | H01L 25/0753 |

FOREIGN PATENT DOCUMENTS

| | | |
|---|---|---|
| JP | 213093557 A | 5/2013 |
| KR | 1020100030805 A | 3/2010 |
| KR | 1020100044060 A | 4/2010 |
| KR | 1020120022410 A | 3/2012 |
| KR | 101324987 B1 * | 11/2013 |
| KR | 101324987 B1 | 11/2013 |

OTHER PUBLICATIONS

English translation of Chinese Office Action from related Chinese Patent Application No. 201680026521.1 (dated Aug. 2020) (12 pages).

* cited by examiner

ULTRAVIOLET RAY EMITTING DEVICE HAVING MAXIMIZED ELECTRODE AREA FOR IMPROVED HEAT DISSIPATION

CROSS REFERENCE TO RELATED APPLICATIONS

This patent document is a 35 U.S.C. § 371 National Stage application of PCT Application No. PCT/KR2016/004281, filed on Apr. 25, 2016, which further claims the benefits and priorities of prior Korean Patent Application No. 10-2015-0064060, filed on May 7, 2015. The entire disclosures of the above applications are incorporated by reference in their entirety as part of this document.

TECHNICAL FIELD

The present invention relates to a light emitting device, and more particularly, to a high output UV light emitting device having high reliability and including a plurality of light emitting elements.

BACKGROUND ART

A light emitting diode is an inorganic semiconductor element that emits light generated by recombination of electrons and holes. Particularly, a UV light emitting element may be widely used in various fields including UV curing, UV sterilization, white light sources, medical applications, and equipment accessories. As compared with a light emitting element that emits near-UV light (light having a peak wavelength in the range of about 340 nm to about 400 nm), a deep UV light emitting element emitting light having a shorter wavelength (light having a peak wavelength of about 340 nm or less, specifically about 200 nm to about 340 nm) can emit high-intensity light in the UV-C region. Thus, such a deep UV light emitting element is used in various fields such as medical instruments.

Light emitted from a UV light emitting element is relatively high in energy, as compared with light emitted from a visible light emitting element. In manufacture of a light emitting device such as an LED package or an LED module using a UV light emitting element, if components of the light emitting device are formed of the same material as those of a visible light emitting device, the components are likely to be damaged by UV light. Particularly, since a UV light emitting device used for UV curing or the like has high output power, components of the UV light emitting device other than a UV light emitting element are required to have high reliability.

A deep UV light emitting element has lower luminous efficacy than a visible light emitting element. Thus, in the deep UV light emitting element, remaining energy not output as light is emitted as heat. Accordingly, for an application requiring high optical power, it is difficult to obtain light having required intensity only using a package including a single chip. When a deep UV light emitting element is used in such an application requiring high optical power, a multi-chip package or a chip-on-board (COB)-type light emitting device including a plurality of unit chips is required to compensate for the low luminous efficacy. However, such a light emitting device including a plurality of light emitting chips generates too much heat relative to output light energy thereof. For example, JP2006-508514 A discloses a lighting apparatus including a plurality of light emitting diodes. However, this lighting apparatus has a structure in which the lighting emitting diodes are connected to a linear electrode pattern and thus exhibit poor heat dissipation efficiency. Further, a UV light emitting device employing such a structure is likely to have poor reliability.

DISCLOSURE

Technical Problem

It is an aspect of the present invention to provide a high-power output UV light emitting device in which the area of electrodes connected between light emitting elements is maximized to increase the amount of heat emitted through the electrodes, thereby improving durability against UV light and heat dissipation efficiency.

Technical Solution

In accordance with one aspect of the present invention, a light emitting device includes: a first body including a base and at least three conductive patterns disposed on the base, wherein the first body includes a plurality of element mounting regions; and a plurality of light emitting elements disposed in the plurality of element mounting regions of the first body, wherein at least one of the conductive patterns is electrically connected to at least two of the light emitting elements, the at least two light emitting elements are connected to one another in series, at least two of the conductive patterns include a pad electrode region, and the plurality of conductive patterns occupy at least 80% of a surface area of an upper surface of the base and are separated a distance of 200 μm to 2,400 μm from one another.

The conductive patterns may include first to fifth conductive patterns, wherein the first conductive pattern may be disposed along first and second sides of the base, the fifth conductive pattern may be disposed along third and fourth sides of the base opposite the first and second sides, respectively, and the second to fourth conductive patterns may be surrounded by the first and the fifth conductive patterns.

The light emitting device may further include a second body disposed on the first body and including a cavity and first through-holes disposed in the cavity; and a cover disposed on the cavity of the second body, wherein the UV light emitting elements may be disposed in the first through holes, respectively.

The first body may further include: a first insulating portion disposed between the base and the plurality of conductive patterns; and a second insulating portion having openings partially exposing the plurality of conductive patterns.

The second insulating portion may include first openings corresponding to the plurality of element mounting regions and each partially exposing at least two of the plurality of conductive patterns.

The first body may further include a third insulating portion disposed in each of the first openings and surrounding a portion of the conductive patterns, and the portion of the conductive patterns surrounded by the third insulating portion may be defined as an element bonding region.

The first body may further include a fourth insulating portion disposed in a space between the conductive patterns, and the third insulating portion may be formed of the same material as the fourth insulating portion.

The second insulating portion may include a second opening partially exposing at least two of the plurality of conductive patterns, and the portion of the conductive patterns exposed through the second opening may be defined as a pad electrode.

The second body may further include a second throughhole disposed on the second opening of the second insulating portion and partially exposing the conductive pattern exposed through the second opening.

Each of the conductive patterns may include a first metal layer, a second metal layer disposed on the first metal layer, and a third metal layer disposed on the second metal layer.

The third metal layer may be partially exposed through the first opening of the second insulating portion and may include Au.

The second insulating portion may include a photo-solder resist.

The light emitting device may further include a protective device disposed on the first body, wherein the second insulating portion may further include a third opening partially exposing at least two of the plurality of conductive patterns and the protective device may be disposed on the third opening.

The second body may include a protective device groove placed corresponding to the protective device and at least partially passing through the second body from a lower surface of the second body.

The first body may be coupled to the second body through a fastening unit.

The second body may further include a groove indented from a surface of the cavity of the second body, and the second body may be bonded to the cover through an adhesive.

The base and the second body may include Al.

Each of the light emitting elements may include: a submount; and a plurality of light emitting diode chips disposed on the submount.

The light emitting diode chips may be flip-bonded to the submount.

Sides of the conductive patterns facing each other and exposed through the first opening may be separated a distance of 200 µm to 300 µm from each other.

Sides of the conductive patterns facing each other and covered with the second insulating portion may be separated a distance of 500 µm to 1,000 µm from each other.

Advantageous Effects

Exemplary embodiments of the present invention provide a UV light emitting device which includes: a first body on which flip-bonded light emitting elements are mounted; a second body disposed on the first body and surrounding the light emitting elements; and a cover pressed against a cavity of the second body to protect the light emitting elements. In addition, exemplary embodiments of the present invention provide a compact and slim light emitting device, which eliminates a need for a wiring process, thereby simplifying the manufacturing process and thus enabling ease of manufacture and high production yield. Further, exemplary embodiments of the present invention provide a high-power output UV light emitting device which has high heat dissipation efficiency and high reliability.

BEST MODE

Figure 1:
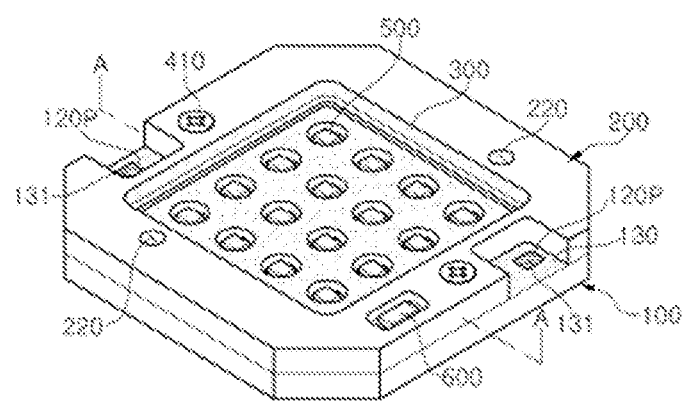
FIG. 1 is a perspective view of a UV light emitting device according to one exemplary embodiment of the present invention.

Hereinafter, exemplary embodiments of the present invention will be described with reference to the accompanying drawings. It should be understood that the exemplary embodiments are provided for complete disclosure and thorough understanding of the present invention by those skilled in the art. Thus, the present invention is not limited to the following embodiments and may be embodied in different ways. In the drawings, the width, length, and thicknesses of various components may be exaggerated for convenience. It will be understood that when an element such as a layer, film, region or substrate is referred to as being placed "above"/"below" or "on"/"under" another element, it can be directly placed on the other element, or intervening layer(s) may also be present. It should be noted that like components will be denoted by like reference numerals throughout the specification.

Figure 2:
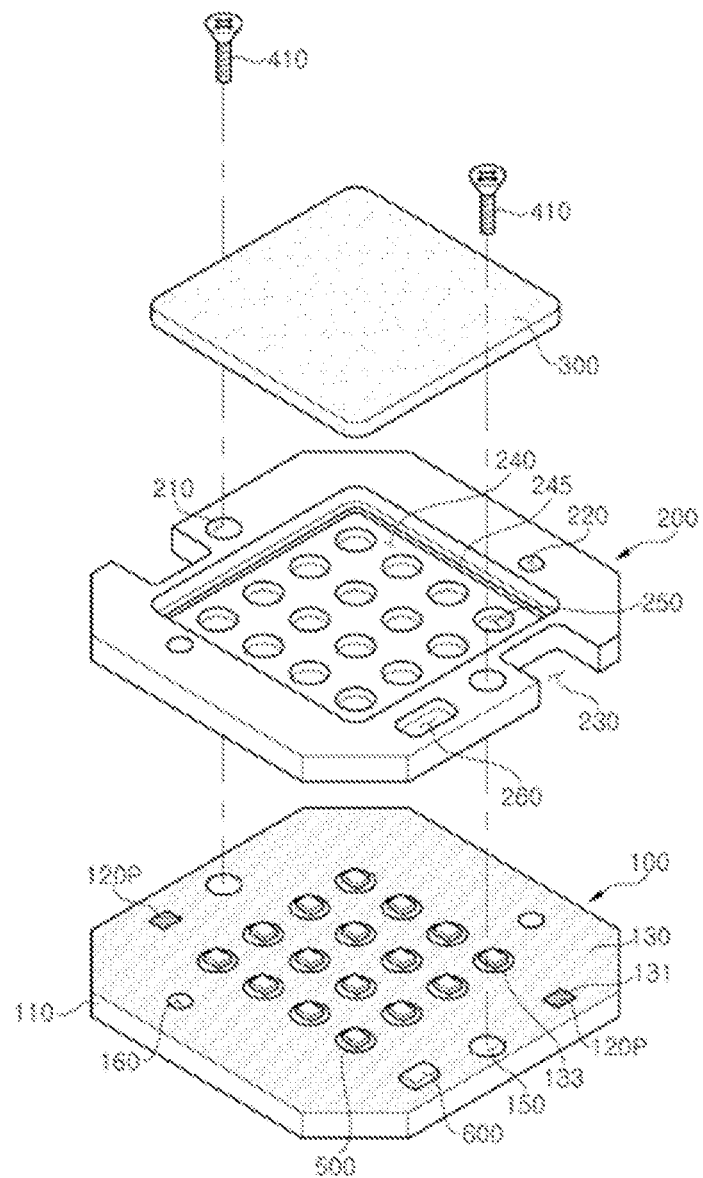
FIG. 2 is an exploded perspective view of the UV light emitting device according to the exemplary embodiment of the present invention.
Figure 3:
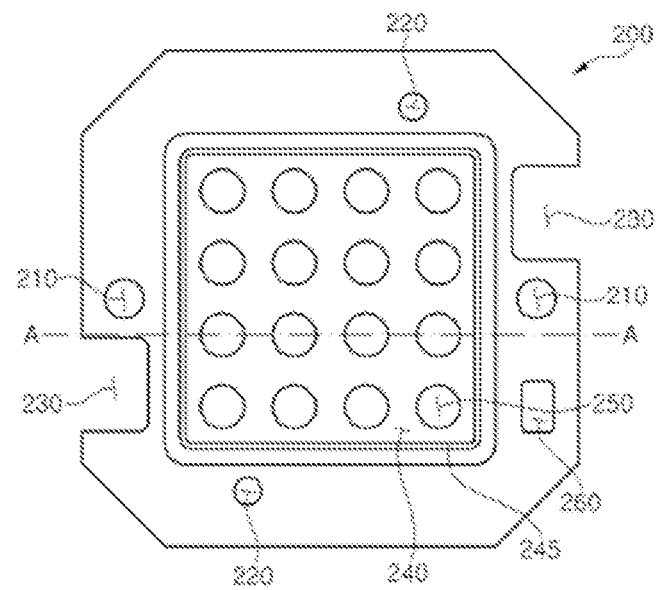
FIG. 3 is a plan view of a second body of the UV light emitting device according to the exemplary embodiment of the present invention.
Figure 4A:
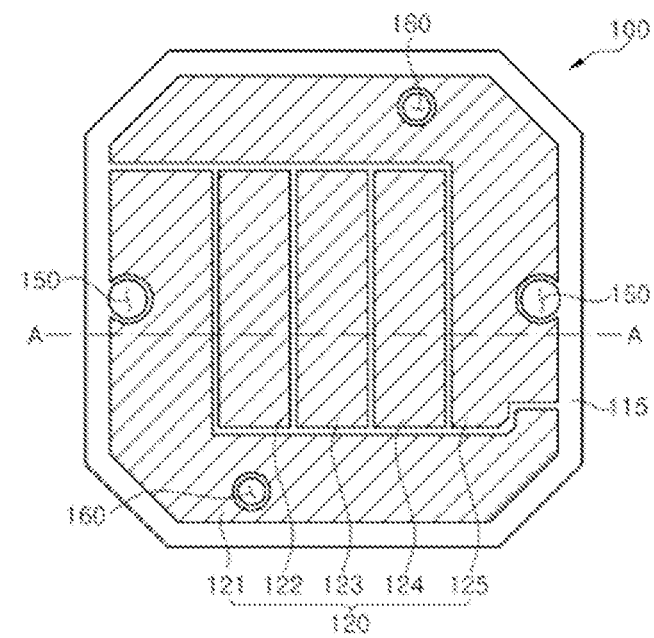
FIGS. 4a and 4b are plan views of a first body of the UV light emitting device according to the exemplary embodiment of the present invention.
Figure 4B:
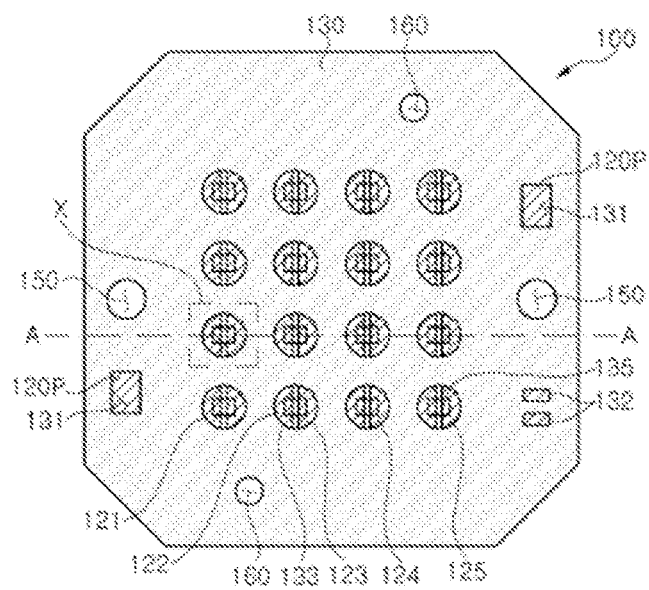
Figure 5:
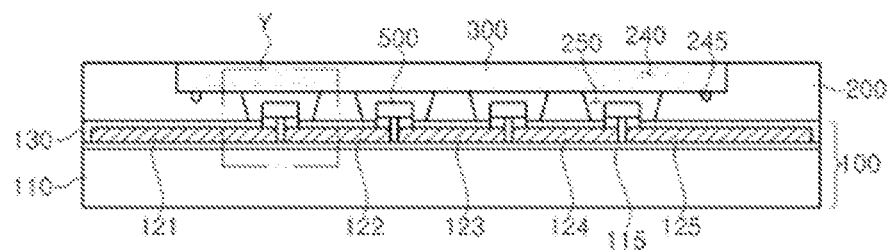
FIG. 5 is a sectional view of the UV light emitting device according to the exemplary embodiment of the present invention.
Figure 6A:
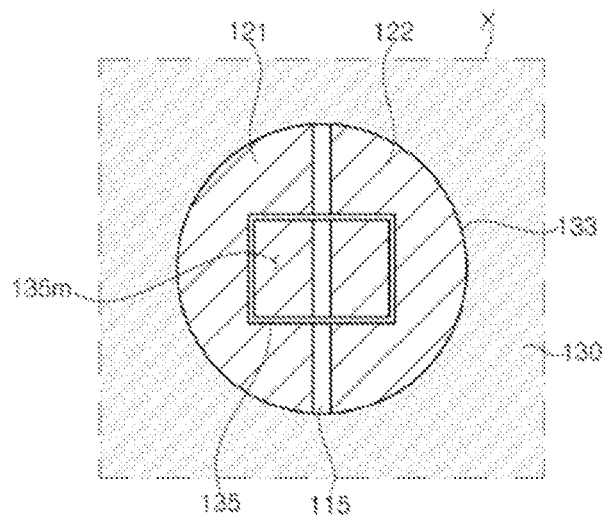
FIGS. 6a and 6b are an enlarged plan view and an enlarged sectional view of the UV light emitting device according to the exemplary embodiment of the present invention, respectively.
Figure 6B:
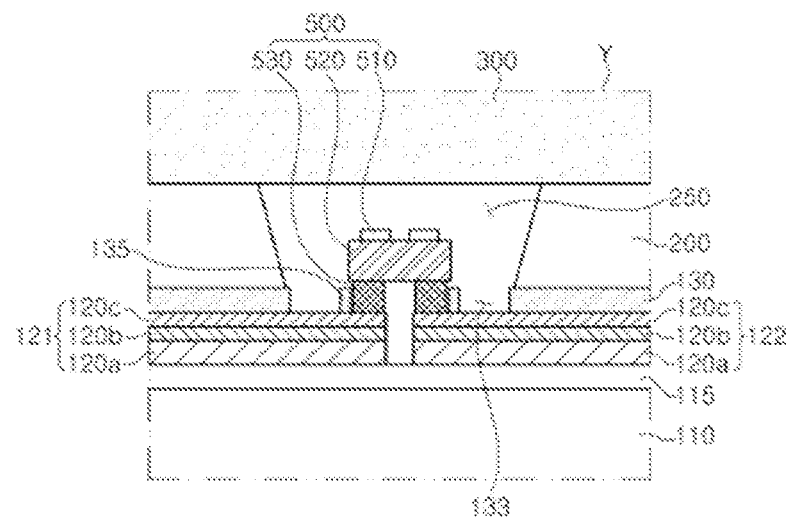

FIGS. 1 to 6b are views of a UV light emitting device according to one exemplary embodiment of the present invention. Specifically, FIG. 1 is a perspective view of the UV light emitting device and FIG. 2 is an exploded perspective view of the UV light emitting device. FIG. 3 is a plan view of a second body 200 of the UV light emitting device and FIGS. 4a and 4b are plan views of a first body 100 of the UV light emitting device. FIG. 5 is a sectional view taken along line A-A of FIGS. 1 to 4b, FIG. 6a is an enlarged plan view of region X of FIG. 4b, and FIG. 6b is an enlarged sectional view of region Y of FIG. 5.

Referring to FIGS. 1 to 6b, a UV light emitting device according to one exemplary embodiment of the present invention includes a first body 100, a second body 200 disposed on the first body 100, a cover 300 disposed on the second body 200, and a plurality of light emitting elements 500. In addition, the UV light emitting device may further include a fastening unit that couples the first body 100 to the second body 200 and a protective device 600.

The plurality of light emitting elements 500 may be disposed on the first body 100, and the second body 200 may include a plurality of openings located on the first body 100 and exposing the plurality of light emitting elements 500. In addition, the second body 200 may include a cavity 240, and the cover 300 is disposed in the cover 300. Now, each component of the UV light emitting device will be described in more detail.

First, the first body 100 will be described in detail with reference to FIGS. 2 and 4a to 6b.

The first body 100 includes a base 110, a conductive pattern 120, and an upper insulating portion 130. In addition, the first body 100 may further include a lower insulating portion 115 and a plurality of holes 150, 160.

The base 110 is located at the bottom of the first body 100 and may serve to support the first body 100. The base 110 may include a material having high thermal conductivity, particularly a metal. In addition, the base 110 may include a metal that is highly resistant to UV light, particularly, light having a peak wavelength of 400 nm or less, specifically 350 nm or less. The base 110 may include, for example, Al, Ag, Cu, and Ni and, in particular, may be formed of an Al bulk metal.

When the base 110 includes Al or is formed of an Al bulk metal, the base 110 can have good processability and can be prevented from being discolored or damaged by UV light, thereby improving reliability and service life of the UV light emitting device. In addition, when the base 110 includes a metal such as Al or is formed of an Al bulk metal, the UV light emitting device can have high heat dissipation efficiency. Particularly, for the high-power UV light emitting device according to this exemplary embodiment, which is driven at high voltage, the base 100 formed of an Al bulk metal having high heat dissipation efficiency advantageously minimizes damage to the UV light emitting device caused by heat generated during driving.

However, it should be understood that other implementations are also possible and the base 110 may be formed of a ceramic material or a polymeric material having high thermal conductivity.

The base 110 may have a polygonal or circular shape, for example, an octagonal shape as shown in drawings. The UV light emitting device according to this exemplary embodiment may have substantially the same shape as the base 110 in plan view. Thus, the UV light emitting device may also have a polygonal shape such as a square or octagonal shape, or a circular shape.

The lower insulating portion 115 is disposed on at least a portion of an upper surface of the base 110. Further, the lower insulating portion may almost completely cover the upper surface of the base 110, as shown in FIG. 5. The lower insulating portion 115 may serve to insulate the conductive pattern 120 from the base 110 having electrical conductivity. Alternatively, if the base 110 has electrical insulation, the lower insulating portion 115 may be at least partially omitted. The lower insulating portion 115 may be formed of silicon oxide, silicon nitride, an insulating ceramic material or polymeric material, or the like.

The conductive pattern 120 may be disposed on the base 110. When the base 110 has electrical conductivity, the conductive pattern may be disposed on the lower insulating portion 115 to be electrically insulated from the base 110. The conductive pattern 120 includes a plurality of conductive patterns and may be designed in various ways in consideration of electrical connection of the light emitting elements 500 to be described below.

FIG. 4a shows an exemplary arrangement of the plurality of conductive patterns 120 disposed on the lower insulating portion 115. Referring to FIG. 4, the conductive pattern 120 may include first to fifth conductive patterns 121, 122, 123, 124, 125, which are spaced apart from one another to be electrically insulated, and the lower insulating portion 115 may be exposed between the conductive patterns 121, 122, 123, 124, 125. The first conductive pattern 121 may be disposed along a first side of the base 110 and a second side adjacent to the first side, and the fifth conductive pattern 125 may be disposed along a third side of the base opposite the first side and a fourth side of the base opposite the second side. As such, the first conductive pattern 121 and the fifth conductive pattern 125 may be formed along the sides of the base 110 and the second to fourth conductive patterns 122, 123, 124 may be disposed in a region surrounded by the first and fifth conductive patterns 121, 125. The second to fourth conductive patterns 122, 123, 124 may be spaced apart from one another and may have an elongated shape, as shown in FIG. 4a. Particularly, the first conductive pattern 121 and the fifth conductive pattern 125 may be partially adjacent to one another, such that the protective device 600, which will be described below, can be electrically connected to the first and fifth conductive patterns 121, 125. Since the second to fourth conductive patterns 122, 123, 124 are surrounded by the first conductive pattern 121 and the fifth conductive pattern 125, it is possible to minimize reduction in adhesion between the first body 100 and the second body 200 due to distance between the patterns upon binding of the first body to the second body. It should be understood that the arrangement of the plurality of conductive patterns 120 may vary depending upon electrical connection of the light emitting elements 500.

In addition, the conductive pattern 120 may almost completely cover the upper surface of the base 110. That is, the conductive pattern 120 may be disposed on substantially the entire upper surface of the base 110, as shown in FIG. 4a. For example, the conductive pattern 120 may cover about 80% or more of the area of the upper surface of the base 110. When the conductive pattern 120 covers about 80% or more of the area of the upper surface of the base 110, heat generated during operation of the light emitting elements 500 can be effectively transferred to the base 110. Here, the base 110 including, for example, Al, has high heat dissipation efficiency and thus can efficiently discharge heat generated from the light emitting elements 500.

The arrangement of the conductive pattern 120 as described above allows the conductive pattern 120 to occupy about 80% or more of the area of the upper surface of the base 110. In addition, the arrangement of the conductive pattern as described above allows the second to fourth conductive patterns 122, 123, 124, which provide an area for mounting of the light emitting elements 500, to account for 50% or more of the total area of the conductive pattern 120. As a result, the UV light emitting device can have high heat dissipation efficiency. Further, since the conductive pattern 120 is disposed on substantially the entire upper surface of the base 110, the first body 100 can be effectively pressed against the second body 200, thereby improving stability and reliability of the UV light emitting device.

In addition, the plurality of conductive patterns 120 may be separated a distance of about 200 µm to 2,400 µm from one another. Further, distances between the plurality of conductive patterns 120 may be varied. For example, the distance between portions of the conductive patterns 120 exposed through a third opening 133, that is, portions of the conductive patterns 120 corresponding to a element mounting region may be shorter than the distance between portions of conductive patterns 120 covered with the second insulating portion 130. Referring to FIG. 4a, each of the second to fourth conductive patterns 122, 123, 124 may have first sides partially exposed through the third opening 133 and second sides located between the first sides and covered with the second insulating portion 130. In addition, each of the first and fifth conductive patterns 121, 125 may have a third side partially exposed through the third opening 133 and a fourth side facing the second sides of the second to fourth conductive patterns 122, 123, 124. Here, the distance between the first and third sides facing each other may range from about 200 µm to about 300 µm, and the distance between the first sides facing each other may also range from about 200 µm to about 300 µm. In addition, the distance between the second and fourth sides facing each other may range from about 500 µm to about 1000 µm. Further, the distance between portions of the first conductive pattern 121 and the fifth conductive pattern 125 facing each other may range from about 500 µm to about 1000 µm. However, in a region where the protective device 600 is mounted, the distance between portions of the first conductive pattern 121 and the fifth conductive pattern 125 facing each other is not limited to this range and may be longer depending on the characteristics of the protective device 600.

Thus, the UV light emitting device according to this exemplary embodiment has high heat dissipation efficiency. In addition, the UV light emitting device includes the plurality of light emitting elements 500 to have high optical power while exhibiting good heat dissipation characteristics and thus high reliability. Further, the conductive pattern 120 may include a metal and may be composed of a single layer or multiple layers. When the conductive pattern 120 is composed of multiple layers, the conductive pattern 120 may include a plurality of metal layers. FIG. 6b is an enlarged view of region Y of FIG. 5. Referring to FIG. 6b, at least one of the first to fifth conductive patterns 121, 122, 123, 124, 125 may include a first metal layer 120a, a second metal layer 120b formed on the first metal layer 120a, and a third metal layer 120c formed on the second metal layer 120b. The first metal layer 120a may include a metal having good adhesion to the lower insulating portion 115 and good thermal conductivity and electrical conductivity, for example, Cu. The third metal layer 120c may include a metal having good electrical conductivity, high resistance to UV light, and good reflectivity to UV light, for example, Au. The second metal layer 120b may include a metal having good adhesion to the first and third metal layers 120a, 120c and good electrical conductivity and thermal conductivity, for example, Ni. Particularly, when the third metal layer 120c, which is the uppermost layer of the conductive pattern 120, includes Au, it is possible to minimize damage and discoloration of the conductive pattern 120 caused by UV light, thereby improving reliability of the UV light emitting device.

However, it should be understood that the materials for forming the first to third metal layers 120a, 120b, 120c are not limited to the aforementioned metals. In other words, although the conductive pattern 120 has been described to have a multilayer structure of Cu/Ni/Au, in addition or as an alternative thereto, the conductive pattern 120 may include other metals such as Pt, Pd, Rh, W, Ti, Al, Mg, and Ag.

The upper insulating portion 130 is disposed on the conductive pattern 120 and includes openings 131, 132, 133 exposing the conductive pattern 120. The upper insulating portion 130 partially covers the conductive pattern 120a. In addition, the upper insulating portion may almost completely cover the upper side of the base 110 except for the openings 131, 132, 133. As a result, the base 110 can be electrically isolated from the second body 200 to be described below.

The upper insulating portion 130 may include at least two first openings 131 through which the conductive pattern 120 is partially exposed. Here, among the first to fifth conductive patterns 121, 122, 123, 124, 125, different conductive patterns may be exposed through the first openings 131, respectively. FIG. 4b is a plan view of the first body 100 in which the light emitting elements 500 and the protective device 600 are omitted for convenience. Referring to FIG. 4b, the first openings 131 expose the first conductive pattern 121 and the fifth conductive pattern 125. Each of the exposed portions of the conductive patterns 121, 125 may correspond to a pad electrode for connecting the UV light emitting device to an external power source. Thus, at least two pad electrodes 120p may function as positive and negative pad electrodes 120p, respectively. Alternatively, the conductive pattern 120 may be partially exposed to provide at least three pad electrodes 120p. The location and number of the first openings 131 correspond to the location and number of the pad electrodes 120p and thus may be varied, as needed, in use of the UV light emitting device in various applications.

In addition, the upper insulating portion 130 may include at least two second openings 132 through which the conductive pattern 120 is partially exposed. Here, among the first to fifth conductive patterns 121, 122, 123, 124, 125, different conductive patterns may be exposed through the at least two first openings 131, respectively. Referring to FIG. 4b, the second openings 132 expose the first conductive pattern 121 and the fifth conductive pattern 125, respectively. Here, the distance between the second openings 132 may be such that the protective device 600 can be mounted on portions of the first conductive pattern 121 and the fifth conductive pattern 125 which are exposed through the second openings 132, respectively. In other words, as described above, the first and fifth conductive patterns 121, 125 may be partially adjacent to each other, such that the protective device 600 can be mounted on parts of the portions of the first and fifth conductive patterns adjacent to each other. The protective device 600 may include, for example, a Zener diode, a TSV, or the like and serves to prevent the light emitting elements 500 from being damaged or destroyed by electrostatic discharge, surge, or the like.

Further, the upper insulating portion 130 includes a plurality of third openings 133. At least two of the conductive patterns 121, 122, 123, 124, 125 are exposed through each of the plurality of third openings 133. For example, the first conductive pattern 121 and the second conductive pattern 122 are exposed through one of the plurality of third openings 133, as shown in FIG. 4b. The plurality of third openings 133 may correspond to element mounting regions in which the light emitting elements 500 are mounted, respectively. In other words, the third openings 133 may be formed corresponding to the location and number of the light emitting elements 500 to be mounted. For example, as shown in FIG. 4b, the third openings 133 may be arranged in 4 rows and 4 columns, and adjacent pairs of the conductive patterns 121, 122, 123, 124, 125 are exposed through each of the third openings 133. That is, the first and second conductive patterns 121, 122 are partially exposed through each of the third openings 133 in a first column; the second and third conductive patterns 122, 123 are partially exposed through each of the third openings 133 in a second column; the third and fourth conductive patterns 123, 124 are partially exposed through each of the third openings 133 in a third column; and the fourth and fifth conductive patterns 124, 125 are partially exposed through each of the third openings 133 in a fourth column.

The light emitting elements 500 may be disposed in the element mounting regions defined by the third openings 133, respectively. Here, each of the light emitting elements 500 may be electrically connected to the conductive patterns 121, 122, 123, 124, 125 exposed through the third opening 133. Thus, electrical connections between the plurality of light emitting elements 500 can be controlled in various ways by varying the correlation and arrangement of the conductive patterns 121, 122, 123, 124, 125 exposed though the third openings 133. For example, in this exemplary embodiment, the light emitting elements 500 disposed in the third openings 133 in the same row are connected to one another in series, and the light emitting elements 500 disposed in the third openings 133 in the same column are connected to one another in parallel. However, it should be understood that other implementations are also possible and the plurality of light emitting elements 500 may be electrically connected to one another in series, parallel, or anti-parallel.

A third insulating portion 135 defines a bonding region 135*m* such that each of the light emitting elements 500 can be aligned with the bonding region 135*m* during mounting of the light emitting element 500 on the first body 100, thereby facilitating manufacture of the UV light emitting device according to this exemplary embodiment. In addition, the third insulating portion 135 allows the bonding region 135*m* to be better distinguished, thereby effectively preventing short circuit between the conductive patterns 120 caused by a solder or conductive adhesive during mounting of the light emitting element 500. Further, light from the light emitting element 500 can be more effectively reflected by the rest of the conductive pattern 120 exposed through the third opening 133 excluding a portion covered with the third insulating portion 135. Particularly, when the conductive pattern 120 is composed of multiple layers, as described above, the uppermost layer of the conductive pattern 120 exposed through the third opening 133 may include Au. Since the metal layer including Au is highly resistant to UV light, it is possible to prevent increase in electrical resistance and decrease in luminous intensity caused by damage of the conductive pattern 120 due to UV light from the light emitting element 500.

The first body 100 may include the third insulating portion 135 disposed within the element mounting region. FIG. 6*a* is an enlarged plan view of the element mounting region exposed through the third opening 133, which corresponds to region X of FIG. 4*b*. FIG. 6*b* is an enlarged sectional view of the perimeter of the element mounting region exposed through the third opening 133, which corresponds to region Y of FIG. 5.

Referring to FIGS. 6*a* and 6*b*, the third insulating portion 135 may be disposed within the third opening 133, specifically, on the conductive pattern 120 exposed through the third opening 133. The third insulating portion 135 may surround some portion of the conductive pattern 120. For example, the third insulating portion 135 may be formed at substantially the center of the third opening 133 to surround a portion of the first conductive pattern 121 and a portion of the second conductive pattern 122, as shown in FIG. 6*a*. Here, a region surrounded by the third insulating portion 135 may be defined as the bonding region 135*m*, and the light emitting element 500 may be bonded to the bonding region 135*m*, as shown in FIG. 6*b*. Particularly, the light emitting element 500 may be flip-bonded to the mounting region within the third opening 133.

The light emitting element 500 may include any typical semiconductor UV light emitting element without limitation. For example, the light emitting element 500 may include a light emitting diode chip 510 and may further include a submount 520 and a bump electrode 530, as shown in FIG. 6*b*.

The light emitting diode chip 510 may be a nitride-based semiconductor light emitting diode chip and may emit light having a peak wavelength of about 400 nm or less, specifically 350 nm or less, more specifically 310 nm or less. In addition, the light emitting diode chip 510 may be a flip chip-type light emitting diode chip, which is bonded and electrically connected to the submount 520. The light emitting element 500 may include at least one light emitting diode chip 510. For example, the light emitting element 500 may include four light emitting diode chips 510 arranged in a substantially square pattern on the submount 520.

The submount 520 is disposed under the at least one light emitting diode chip 510 to electrically connect the light emitting diode chip 510 to the conductive pattern 120. The submount 520 may have any suitable structure for electrically connecting the light emitting diode chip 510 to the conductive pattern 120 without limitation. For example, the submount 520 may include a high-thermal conductivity ceramic substrate such as MN and electrodes formed on both sides of the ceramic substrate. Here, the electrodes on the upper and lower sides of the ceramic substrate may be electrically connected to one another through a via electrode. Since the submount 520 includes a high-thermal conductivity material, heat generated during driving of the light emitting diode chip 510 can be effectively dissipated. However, it should be understood that other implementations are also possible.

The submount 520 may be brought into electrical contact with the conductive patterns 121, 122, 123, 124, 125 exposed through the third openings 133 through the bump electrode 530. As a result, the UV light emitting diode chip 510 can be electrically connected to the conductive pattern 120.

When the light emitting element 500 includes the submount 520, the plurality of light emitting diode chips 510 can be mounted on the submount 520 to improve output of UV light emitted from the single light emitting element 500. The UV light emitting device according to this exemplary embodiment includes the plurality of light emitting elements 500 including the plurality of light emitting diode chips 510 and thus can have high power output. In addition, since the submount 520 is disposed under the light emitting diode chip 510 to improve heat dissipation efficiency, it is possible to reduce heat-induced damage of the UV light emitting device even when the UV light emitting device is driven under high voltage and high-power conditions.

Figure 7:
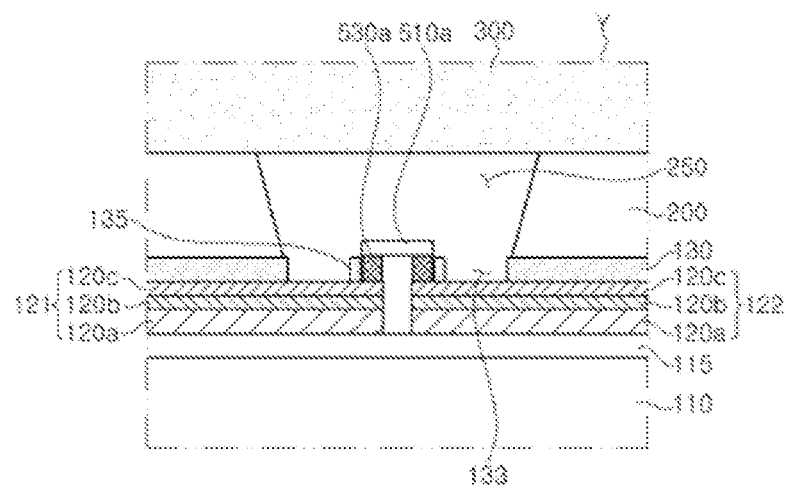
FIG. 7 is an enlarged sectional view of a UV light emitting device according to another exemplary embodiment of the present invention.

Alternatively, the light emitting element 500 may be a chip-on-board type light emitting element, in which a light emitting diode chip 510*a* is mounted on the first body 100 without using the submount 520. For example, the light emitting element 500 may include a light emitting diode chip 510*a* and a bump electrode 530*a* electrically connecting the light emitting diode chip 510 to the conductive pattern 120, as shown in FIG. 7. When the light emitting element 500 does not include the submount 520, the UV light emitting device can be miniaturized.

In the case where the light emitting element 500 includes the submount 520 as well as the case where the light emitting element is a chip-on-board type light emitting element, in which the light emitting diode chip 510 is mounted on the first body 100, the light emitting element 500 may be flip chip-bonded. Thus, a need for a wire bonding process can be eliminated, whereby the manufacturing process of the UV light emitting device can be simplified and UV-induced damage to a wire can be prevented, thereby improving reliability of the UV light emitting device. Further, a space for wire bonding is not required, whereby the thickness of the UV light emitting device can be further reduced. Moreover, since there is no need to establish electrical connection through a wire, it is unnecessary to consider wire positioning in design of the UV light emitting device, thereby improving design flexibility. Thus, the UV light emitting device can be readily changed in design depending on applications thereof to be optimized for each of the applications.

Figure 8A:
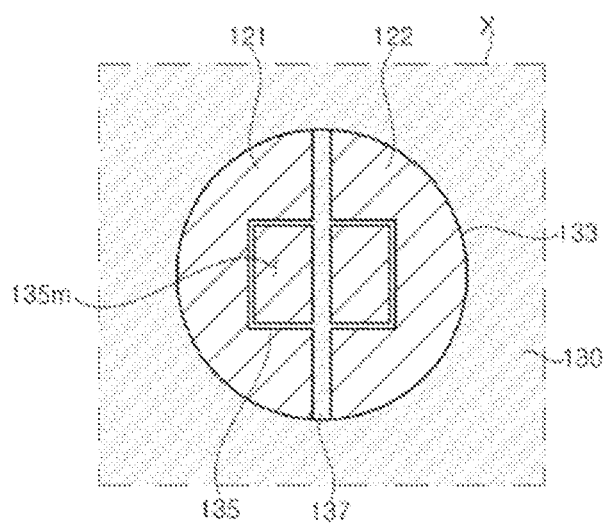
FIGS. 8a and 8b are an enlarged plan view and an enlarged sectional view of a UV light emitting device according to a further exemplary embodiment of the present invention, respectively.
Figure 8B:
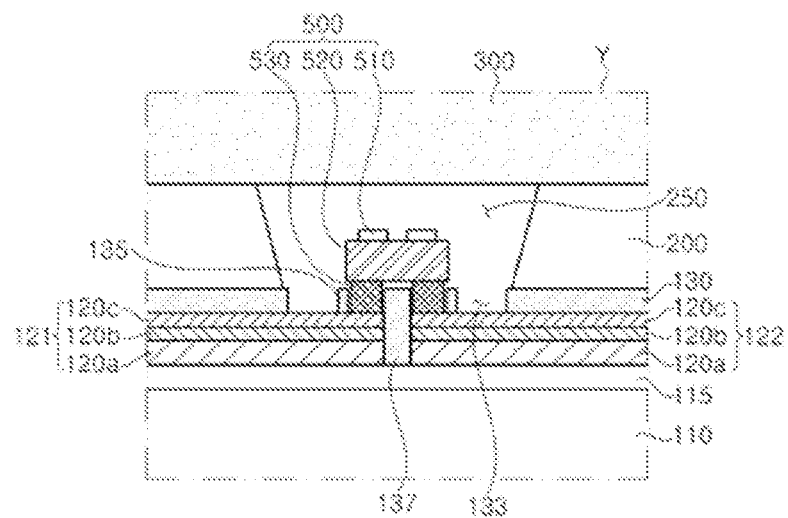
Figure 9A:
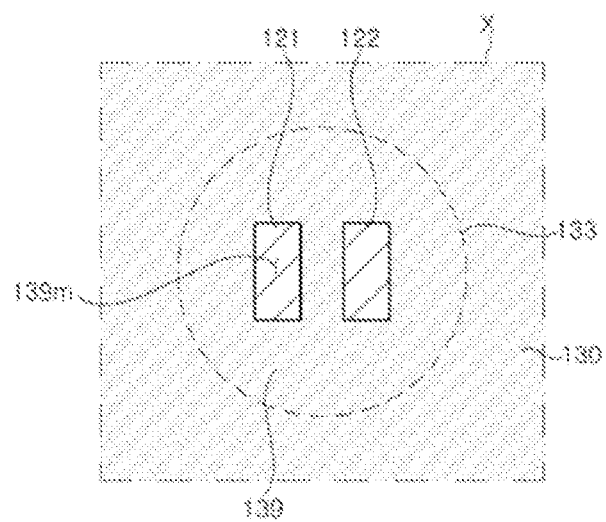
FIGS. 9a and 9b are an enlarged plan view and an enlarged sectional view of a UV light emitting device according to yet another exemplary embodiment of the present invention, respectively.
Figure 9B:
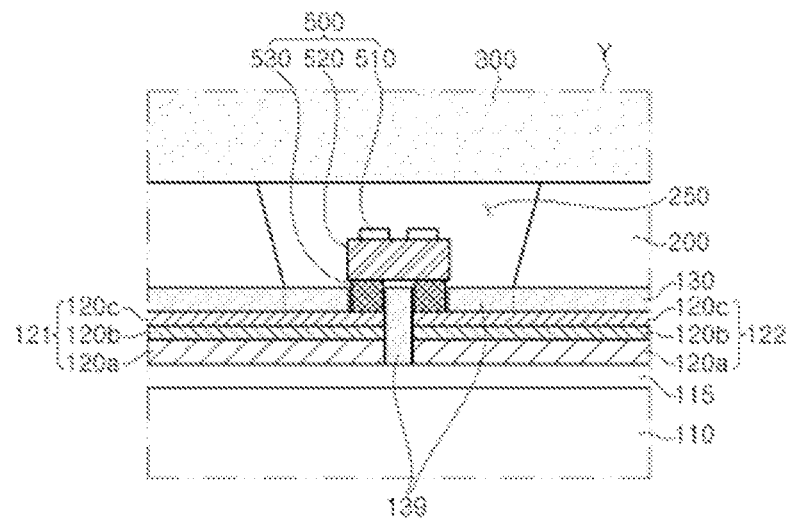

The third insulating portion 135 formed in the element mounting region exposed through the third opening 133 may be modified in various ways. For example, in one embodiment as shown in FIGS. 8a and 8b, the first body 100 may further include a fourth insulating portion 137 disposed in a space between the conductive patterns 120. Here, the fourth insulating portion 137 may be integrally formed with the third insulating portion 135 and may be formed of the same material as the third insulating portion. In this case, a space between the bump electrodes 530 of the light emitting element 500 can be at least partially filled with the fourth insulating portion 137, thereby effectively preventing short circuit between the bump electrodes 530. In another embodiment as shown in FIGS. 9a and 9b, the first body 100 may include a fifth insulating portion 139 which partially covers an area exposed through the third opening 133. The fifth insulating portion 139 allows each of the first conductive pattern 121 and the second conductive pattern 122 to be partially exposed to form a bonding region 139m to which the light emitting element 500 is bonded. Since the bonding region 139m is almost completely covered with the mounted light emitting element 500, the conductive pattern 120 can be hardly exposed though the third opening 133. According to this exemplary embodiment, even when the uppermost portion of the conductive pattern 120 is formed of a metal having relatively low durability against UV light, UV-induced damage of the conductive pattern 120 can be prevented.

The second insulating portion 130, the third insulating portion 135, the fourth insulating portion 137, and the fifth insulating portion 139 may be formed of the same material or different materials. Each of the second to fifth insulating portions 130, 135, 137, 139 may be formed of an insulating material and may include, for example, a photo-solder resist (PSR).

Referring to FIGS. 1 to 6b again, the first body 100 may include a first hole 150 and may further include a second hole 160. The first hole 150 and the second hole 160 may at least partially pass through the first body 100. When the first and second holes 150, 160 do not completely pass through the first body 100, the first and second holes 150, 160 may have a groove shape partially passing through the first body 100 from the upper side of the first body. The first hole 150 may provide a space into which the fastening unit 410 coupling the first body 100 to the second body 200 is inserted, as described below. The second hole 160 serves to help the first body 100 be easily aligned with the second body 200 in manufacture of the UV light emitting device according to this exemplary embodiment.

The second body 200 is disposed on the first body 100. The second body 200 includes a cavity 240 indented downward from an upper surface thereof and a plurality of first through-holes 250 disposed in the cavity 240 and passing through the second body 200. In addition, the second body 200 may further include a second through-hole 210, a third through-hole 220, a fourth through-hole 230, a protective device hole 260, and a groove 245.

Referring to FIGS. 1, 2, 3, and 5, the cavity 240 of the second body 220 is indented from the upper surface of the second body 200. The cavity 240 provides a space in which the cover 300 is disposed and may have a depth that is substantially similar to or larger than the thickness of the cover 300. The groove 245 may be formed on an inner surface of the cavity 240. The groove 245 may be formed along an edge of the cavity 240, without being limited thereto.

The plurality of first through-holes 250 is formed in the cavity 240 and placed substantially corresponding to the third openings 133, respectively. As a result, the light emitting elements 500 can be exposed through the first through-holes 250, respectively. A sidewall of each of the first through-holes 250 may serve as a reflector for each of the light emitting elements 500. Thus, the inclination of the side wall of the first through-hole 250 may be adjusted in consideration of beam angle of the UV light emitting device. For example, the side surface of the first through-hole 250 may be substantially perpendicular to the upper surface of the first body 100, or may be inclined at a predetermined angle with respect to the upper surface of the first body 100.

In addition, the uppermost end of the sidewall of the first through-hole 250 may be placed higher than the uppermost end of the light emitting element 500. In this case, the light emitting element 500 may be disposed in an indented region formed by the first through-hole 250 without protruding outside the first through-hole 250. As a result, the cover 300 can be tightly pressed against the uppermost end of the side wall of the first through-hole 250, that is, the inner surface of the cavity 240, thereby effectively protecting the light emitting element 500 from an external environment. If the cover 300 is spaced apart from the uppermost end of the sidewall of the first through-hole 250, that is, the inner surface of the cavity 240, light loss can occur through the space. According to this exemplary embodiment, the cover 300 may be tightly pressed against or bonded to the uppermost end of the sidewall of the first through-hole 250, that is, the inner surface of the cavity 240 to prevent light loss through the aforementioned space, thereby improving luminous efficacy of the UV light emitting device. Further, according to this exemplary embodiment, the light emitting element 500 is flip chip-bonded to the first body 100, thereby eliminating a need to separate the cover 300 from the inner surface of cavity 240 for wire formation. In other words, the UV light emitting device according to this exemplary embodiment includes the flip chip-type light emitting elements 500, the second body 200 including the first through-holes 250, and the cover 300 tightly pressed against the surface of the cavity 240 of the second body 200 and thus can be reduced in size while securing high luminous efficacy, high reliability, and high power output.

The second through-hole 210 may be placed corresponding to the first hole 150 of the first body 100 and serves to provide a space in which the fastening unit 410 coupling the first body 100 to the second body 200 is inserted. The third through-hole 220 may be placed corresponding to the second hole 150 of the first body 100 and serves to help the first body 100 be easily aligned with the second body 200 in manufacture of the UV light emitting device according to this exemplary embodiment. The fourth through-hole 230 may be disposed on the first opening 131 of the second insulating portion 130, such that the pad electrode 120p can be exposed through the fourth through-hole 230. Although the fourth through-hole 230 is shown as being indented from a side surface of the second body 200, it should be understood that other implementations are also possible and the fourth through-hole may vertically pass through the second body 200.

The protective device hole 260 may be placed correspondingly to the protective device 600 and serves to surround the protective device 600. The height of the protective device 600 may be smaller than the depth of the protective device hole 260 such that the protective device 600 does not extend above the second body 200. Since the protective device 600 is surrounded by the protective device hole 260, light emitted from the light emitting element 500 is prevented from directly reaching the protective device 600. As a result, it is possible to prevent light emitted from the light emitting element 500 from being absorbed by the protective device 600 and causing reduction in luminous efficiency of the light emitting device. Although the protective device hole 260 is shown as vertically passing through the second body 200, it should be understood that other implementations are also possible. Alternatively, the protective device hole 260 may have a groove shape indented from a lower surface of the second body 200, in which case the protective device 600 is not exposed outside of the UV light emitting device.

The second body 200 may be formed of a material having high reflectivity to UV light and high resistance to UV light, and may include, for example, Al, Ag, Cu, and Ni. The second body 200 may include the same material as the base 110. In addition, the second body may be formed of the same material as the base 110, for example, an Al bulk metal. When the second body 200 includes Al or is formed of an Al bulk metal, the second body 200 can have good processability and can be prevented from being discolored or damaged by UV light, thereby improving reliability and service life of the UV light emitting device. However, it should be understood that other implementations are also possible.

An adhesive (not shown) may be further disposed between the first body 100 and the second body 200. The adhesive serves to bond the first body 100 to the second body 200 and may be formed of, for example, a polymer or ceramic material. In addition, the adhesive may be a film- or tape-type adhesive. The adhesive may be disposed on at least a portion of the upper surface of the first body 100 and may be disposed, for example, in an area where the upper insulating portion 130 is disposed. Particularly, the adhesive may be disposed throughout the upper insulation portion 130 excluding portions at which the third openings 133 are located. As such, the adhesive is formed outside the third openings 133 and thus can be prevented from being damaged by UV light emitted from the light emitting elements 500. However, it should be understood that other implementations are also possible and the adhesive may be omitted.

The cover 300 may be disposed on the second body 200, particularly on the cavity 240 of the second body 200. The cover 300 may be brought into contact with or pressed against the inner surface of the cavity 240 of the second body 200. The cover 300 may be bonded to the second body 200 through, for example, an adhesive. Here, the adhesive may be formed along an edge of the cavity 240. In addition, the adhesive for bonding of the cover 300 to second body 200 may be disposed at least a portion of the groove 245 formed in the cavity 240. Thus, the groove 245 can prevent the adhesive from spreading and flowing into the element mounting region through the first through-hole 240 during bonding of the cover 300 to the second body 200. If the adhesive flows into the element mounting region or adheres to the side wall of the first through-hole 240, the adhesive can be discolored by UV light, causing reduction in luminous efficacy of the UV light emitting device. In other words, the groove 245 can prevent reduction in optical power of the UV light emitting device due to the adhesive.

The cover 300 may include a material that is highly resistant to UV-induced deformation or discoloration. For example, the cover 300 may be formed of a ceramic material such as glass or quartz, or a polymeric material having high resistance to UV, such as a fluorine-based polymer.

In addition, the thickness of the cover 300 may be smaller than the depth of the second body 200. In this case, an upper surface of the cover 300 may be placed lower than an upper surface of the second body 200. Since the cover 300 does not extend above the upper surface of the second body 200, the cover 300 can be effectively prevented from being damaged by external factors.

Further, the first body 100 may be secured to the second body 200 through the fastening unit 410. The fastening unit 410 may include, for example, a bolt or a screw as shown in the drawings. The fastening unit 410 at least partially passes through the second through-hole 210 of the second body 200 and the first hole 150 of the first body 100 to couple the first body to the second body 100.

The location and number of the fastening unit 410 are not particularly limited, and the fastening unit may include, for example, six fastening units 410. Although the fastening unit 410 is shown as being inserted from the second body 200 to the first body 100, it should be understood that other implementations are possible and the fastening unit 410 may be inserted from the bottom of the first body 100 to the second body 200. In this case, the second through-hole 210 of the second body 200 may take the form of a groove on the lower surface of the second body 200, and the first hole 150 of the first body 100 may take the form of a through-hole passing through the first body 100. Thus, the fastening unit 410 is not exposed above the upper surface of the UV light emitting device. However, it should be understood that other implementations are also possible and the fastening unit 410 may have any suitable structure for coupling the first body 100 to the second body 200.

Since the first body 100 is securely coupled to the second body 200 through the fastening unit 410, a separate adhesive does not need to be disposed between the first body 100 and the second body 200, or the first body 100 can be stably coupled to the second body 200 even using a small amount of adhesive. Thus, according to this exemplary embodiment, it is possible to prevent an adhesive between the first body 100 and the second body 200 from being discolored or deformed by UV light and causing deterioration in reliability of the UV light emitting device.

Each of the first body 100 and the second body 200 may further include an additional hole or groove not shown in the drawings. Such a hole or groove helps the UV light emitting device according to the present invention to be easily mounted on, coupled to or joined to an external device to which the UV light emitting device is intended to be applied.

According to the exemplary embodiments of the present invention, it is possible to provide a miniaturized high-power output and high-reliability UV light emitting device which can be manufactured through a simple process.

Although certain exemplary embodiments have been described herein, it should be understood by those skilled in the art that these embodiments are given by way of illustration only, and that various modifications, variations, and alterations can be made without departing from the spirit and scope of the invention. Therefore, the scope of the invention should be limited only by the accompanying claims and equivalents thereof.

What is claimed is:

1. A light emitting device comprising:
a first body comprising a base and first to third conductive patterns disposed on the base, the first body having a plurality of element mounting regions;
a plurality of light emitting elements disposed in the plurality of element mounting regions of the first body, the plurality of element mounting regions including a first element mounting region and a second element mounting region;
a second body comprising a cavity and first through-holes disposed in the cavity; and
a cover disposed to cover the cavity of the second body,
wherein the first conductive pattern is electrically connected to at least two of the plurality of light emitting elements and has a first side, a second side shorter than the first side, a third side parallel to the first side and longer than the second side, and a fourth side parallel to the second side, the first, conductive pattern having an elongated shape, the at least two of the plurality of light emitting elements being connected to each other in series,
the at least two of the plurality of the light emitting elements include a first light emitting element that is disposed in the first element mounting region overlapping with the second conductive pattern and a second light emitting element that is disposed in the second element mounting region overlapping with the third conductive pattern,
the second conductive pattern and the third conductive pattern are disposed to surround the first conductive pattern such that the second conductive pattern extends along the first side and the second side of the first conductive pattern and the third conductive pattern extends along the third side and the fourth side of the first conductive pattern,
each of the second conductive pattern and the third conductive pattern comprises a pad electrode region,
the first to third conductive patterns occupy at least 80% of a surface area of an upper surface of the base and are separated from one another by a distance of 200 μm to 2,400 μm,
the second body is arranged over the first body such that the plurality of the light emitting elements are exposed by the first through holes, respectively,
uppermost ends of sidewalls of the first through holes are placed higher than uppermost ends of the plurality of the light emitting elements,
the cover is configured to contact with the uppermost ends of the sidewalls of the first through holes, and
a lower surface of the cover is spaced apart from upper surfaces of the plurality of the light emitting elements.

2. The light emitting device according to claim 1, wherein the second conductive pattern is disposed along first and second sides of the base, and the third conductive pattern is disposed along third and fourth sides of the base opposite the first and second sides, respectively.

3. The light emitting device according to claim 1, wherein the first body further comprises: a first insulating portion disposed between the base and the first to third conductive patterns; and a second insulating portion disposed on the first to third conductive patterns and having openings partially exposing the first to third conductive patterns.

4. The light emitting device according to claim 3, wherein the openings comprise first openings corresponding to the plurality of element mounting regions, the first openings partially exposing the first to third conductive patterns.

5. The light emitting device according to claim 4, wherein the first body further comprises a third insulating portion disposed in each of the first openings and surrounding a portion of the first to third conductive patterns, the portion of the first to third conductive patterns surrounded by the third insulating portion providing an element bonding region.

6. The light emitting device according to claim 5, wherein the first body further comprises a fourth insulating portion disposed in a space between the first to third conductive patterns, and the third insulating portion includes a same material as the fourth insulating portion.

7. The light emitting device according to claim 4, wherein the openings comprise a second opening partially exposing the first to third conductive patterns.

8. The light emitting device according to claim 7, wherein the light emitting device further comprises a second body comprising a second through-hole disposed to partially expose the first to third conductive patterns exposed through the second opening.

9. The light emitting device according to claim 4, wherein each of the firs(to third conductive patterns comprises a first metal layer, a second metal layer disposed on the first metal layer, and a third metal layer disposed on the second metal layer.

10. The light emitting device according to claim 9, wherein the third metal layer is partially exposed through at least one of the first openings of the second insulating portion and comprises Au.

11. The light emitting device according to claim 3, wherein the second insulating portion comprises a photo-solder resist.

12. The light emitting device according to claim 4, further comprising:
a protective device disposed on the first body,
wherein the second insulating portion further comprises a third opening partially exposing at least two of the first to third conductive patterns and the protective device is disposed in the third opening.

13. The light emitting device according to claim 12, wherein the light emitting device further comprises a second body comprising a protective device groove placed corresponding to the protective device and at least partially passing through the second body from a lower surface of the second body.

14. The light emitting device according to claim 1, wherein the first body is coupled to the second body through a fastening unit.

15. The light emitting device according to claim 1, wherein the second body is bonded to the cover through an adhesive.

16. The light emitting device according to claim 3, wherein the base comprises Al.

17. The light emitting device according to claim 1, wherein each of the plurality of light emitting elements comprises: a submount; and a plurality of light emitting diode chips disposed on the submount.

18. The light emitting device according to claim 17, wherein the light emitting diode chips are flip-bonded to the submount.

19. The light emitting device according to claim 4, wherein the first side of the first conductive pattern and a first side of the second conductive pattern that face each other and are exposed through the first openings are separated from each other by a distance of 200 μm to 300 μm.

20. The light emitting device according to claim 4, wherein the second sides of the first conductive pattern and a second side of the second conductive pattern that face each other and are covered with the second insulating portion are separated from each other by a distance of 500 μm to 1,000 μm.

* * * * *